United States Patent
Fuderer et al.

(10) Patent No.: US 9,964,615 B2
(45) Date of Patent: May 8, 2018

(54) MR IMAGE RECONSTRUCTION USING COMPRESSED SENSING

(71) Applicant: KONINKLIJKE PHILIPS N.V., Eindhoven (NL)

(72) Inventors: Miha Fuderer, Eindhoven (NL); Mariya Ivanova Doneva, Eindhoven (NL)

(73) Assignee: Koninklijke Philips N.V., Eindhoven (NL)

(*) Notice: Subject to any disclaimer, the term of this patent is extended or adjusted under 35 U.S.C. 154(b) by 417 days.

(21) Appl. No.: 14/778,124

(22) PCT Filed: Mar. 12, 2014

(86) PCT No.: PCT/IB2014/059660
§ 371 (c)(1),
(2) Date: Sep. 18, 2015

(87) PCT Pub. No.: WO2014/147518
PCT Pub. Date: Sep. 25, 2014

(65) Prior Publication Data
US 2016/0291106 A1    Oct. 6, 2016

Related U.S. Application Data (60) Provisional application No. 61/803,929, filed on Mar. 21, 2013.

(51) Int. Cl.
*G01R 33/48* (2006.01)
*G01R 33/561* (2006.01)
*G01R 33/565* (2006.01)

(52) U.S. Cl.
CPC ....... *G01R 33/4824* (2013.01); *G01R 33/561* (2013.01); *G01R 33/5611* (2013.01); *G01R 33/56545* (2013.01); *G01R 33/4828* (2013.01)

(58) Field of Classification Search
CPC .............. G01R 33/4824; G01R 33/561; G01R 33/5611; G01R 33/4828; G01R 33/56545
(Continued)

(56) References Cited

U.S. PATENT DOCUMENTS

| | | | |
|---|---|---|---|
| 2008/0061779 A1* | 3/2008 | Feiweier | G01R 33/4818 324/307 |
| 2010/0145185 A1* | 6/2010 | Hong | A61B 5/055 600/420 |

(Continued)

FOREIGN PATENT DOCUMENTS

| WO | 9723844 | 7/1997 |
|---|---|---|
| WO | 2012127341 A1 | 9/2012 |

OTHER PUBLICATIONS

Lustig M. et al:"kt SPARSE: High frame rate (dynamic MRI exploiting spatio-temporal sparsity", International Society for Magnetic Resonance in Medicine. Scientific Meeting and Exhibition. Proceedings, International Society for Magnetic Resonance in Medicine, US, Apr. 1, 2006 (Apr. 1, 2006), p. 1.
(Continued)

*Primary Examiner* — Jay Patidar (57) ABSTRACT

The invention relates to a method of MR imaging of an object (10) placed in an examination volume of a MR device (1). The method comprises the steps of: subjecting the object (10) to an imaging sequence for acquiring MR signal data, wherein the MR signal data are acquired as a function of k-space position and time by using an irregular k-space sampling pattern with sub-sampling of k-space; reconstructing MR image data from the MR signal data, which MR image data comprise spatial dimensions and a frequency dimension, sparsity of the MR image data in a transform domain being exploited for suppressing sub-sampling artefacts in the MR image data. Moreover, the invention relates to a MR device (1) and to a computer program.

6 Claims, 3 Drawing Sheets

(58) Field of Classification Search
USPC .................................................. 324/300–322
See application file for complete search history.

(56) References Cited

U.S. PATENT DOCUMENTS

| | | |
|---|---|---|
| 2010/0207629 A1 | 8/2010 | Trzasko et al. |
| 2011/0058719 A1 | 3/2011 | Trzasko et al. |
| 2013/0088230 A1 | 4/2013 | Eggers |

OTHER PUBLICATIONS

Li Feng et al: "K-t Radial SPARSE-SENSE:Combination of Compressed Sensing and Parallel Imaging with Golden Angle Radial Sampling for Highly Accelerated Volumetric Dynamic MRI",Proceedings of the International Society for Magnetic Resonance in Medicine, 20th Annual Meeting and Exhibition, Melbourne,Australia, May 5-11, 2012,vol. 20, Apr. 21, 2012 (Apr. 21, 2012), p. 81, the whole document.

Ricardo Otazo et al: "Combination of compressed sensing and parallel imaging for highly-accelerated dynamic MRI",Biomedical Imaging (ISBI), 2012 9th IEEE International Symposium on, IEEE, May 2, 2012 (May 2, 2012), pp. 980-983,XP032199179,DOI: 10.1109/ISBI.2012.6235721 ISBN:97 8-1-4577-1857-1 p. 980-p. 982.

Gamper U et al: "Compressed sensing in dynamic MRI",7-10 Magnetic Resonance in Medicine, Academic Press, Duluth, MN, US, vol . 59, No. 2, Feb. 1, 2008 (Feb. 1, 2008), pp. 365-373.

Usman M et al: "A computationally efficient OMP-based compressed sensing reconstruction for dynamic MRI;A computationally efficient OMP-based compressed sensing reconstruction for dynamic MRI", Physics in Medicine and Biology, Institute of Physics Publishing, Bristol GB, vol. 56, No. 7, Mar. 2, 2011 (Mar. 2, 2011), pp. N99-N114.

Daniel Kim et al: "Accelerated phase-contrast cine MRI using k-t SPARSE-SENSE", Magnetic Resonance in Medicine,vol. 67 , No. 4, Apr. 1, 2012 (Apr. 1, 2012), pp. 1054-1064.

Lustig M et al: "Sparse MRI: the application of compressed sensing for rapid MR imaging". Magnetic Resonance in Medicine, Academic Press, Duluth, MN, US, vol. 58, No. 6, Dec. 1, 2007 (Dec. 1, 2007), pp. 1182-1195.

Rachel W. Chan et al: "Temporal stability of adaptive 3D radial MRI using multidimensional golden means". Magnetic Resonance in Medicine, vol. 61, No. 2, Jan. 22, 2009 (Jan. 22, 2009), pp. 354-363.

Mir R et al: "Fast Three-Dimensional k-Space Trajectory Design Using Missile Guidance Ideas", Magnetic Resonance in Medicine, Academic Press, Duluth, MN, US, vol. 52 , Jan. 1, 2004 (Jan. 1, 2004), pp. 329-336.

Liang et al, "Compressed Sensing Dynamic MR Imaging With Partially Known Support" Conf. Proc. IEEE Med. Biol. Society, 2010 p. 2829-2832.

Pruessman et al "Sense Sensitivity Encoding for Fast MRI" Magnetic Resonance in Medicine 1999, 42 (5) p. 1952-1962.

Sodickson et al "Simultaneous Acquisition of Spatial Harmonics . . . " Magnetic Resonance in Medicine 1997, 38, p. 591-603.

Gerig et al , Nonlinear Anisotropic Filtering of MR Data IEEE Transactions on Medical Imaging, 11, (2) p. 221-232 1992.

Bao et al "Noise Reduction for Magnetic Resonance Images via Adaptive Multiscale Products Thresholding" IEEE Transactions on Medical Imaging 22(9) p. 1089-1099 (2003).

Fernandez-Granda et al, "Robustness of Compressed Sensing Parallel MRI in the Presence of Inaccurate Sensitivity Estimates" Conference Proceedings: . . . Annual International Conference of the IEEE Engineering in Medicine and Biology Society. IEEE Engineering in Medicine and Biology Society. Conference—Jan. 2010.

\* cited by examiner

MR IMAGE RECONSTRUCTION USING COMPRESSED SENSING

CROSS REFERENCE TO PRIOR APPLICATIONS

This application is the U.S. National Phase application under 35 U.S.C. § 371 of International Application No. PCT/IB2014/059660, filed on Mar. 12, 2014, which claims the benefit of U.S. Patent Application No. 61/803,929, filed on Mar. 21, 2013. These applications are hereby incorporated by reference herein.

FIELD OF THE INVENTION

The invention relates to the field of magnetic resonance (MR) imaging. It concerns a method of MR imaging of at least a portion of a body of a patient placed in an examination volume of a MR device. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

SUMMARY OF THE INVENTION

According to the MR method in general, the body of the patient to be examined is arranged in a strong, uniform magnetic field whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view, the distribution of the individual nuclear spins produces an overall magnetization which can be deflected out of the state of equilibrium by application of an electromagnetic pulse of appropriate frequency (RF pulse) while the magnetic field of the RF pulse extends perpendicular to the z-axis, so that the magnetization performs a precession about the z-axis. This motion of the magnetization describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°). The RF pulse is radiated toward the body of the patient via a RF coil arrangement of the MR device. The RF coil arrangement typically surrounds the examination volume in which the body of the patient is placed.

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF antennas or coils which are arranged and oriented within the examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, linear magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The signal data obtained via the receiving RF antennas or coils corresponds to the spatial frequency domain and is called k-space data. The k-space data usually includes multiple lines acquired with different phase encoding. Each line is digitized by collecting a number of samples. A set of k-space data is converted to a MR image by means of Fourier transformation or by other per se known reconstruction techniques.

Imaging speed is important in many MR imaging applications. However, the speed at which the MR signal data required for reconstruction of a MR image can be collected is fundamentally limited by physical and physiological constraints. Hence, many recent developments in the MR imaging field aim at reducing the amount of acquired signal data without degrading the quality of the reconstructed MR image. Among many of such developments the theory of Compressed Sensing (CS) has great potential for significant signal data reduction. In CS theory, a signal data set which has a sparse representation in a transform domain can be recovered from sub-sampled measurements by application of a suitable regularisation algorithm. The possibility of sub-sampling leads to a significantly reduced acquisition time. As a mathematical framework for signal sampling and reconstruction, CS prescribes the conditions under which a signal data set can be reconstructed exactly or at least with high image quality even in cases in which the k-space sampling density is far below the Nyquist criterion, and it also provides the methods for such reconstruction. In most existing CS-based MR acquisition and reconstruction schemes the basic CS formulation is used which exploits only the prerequisite that the MR signal data is sparse in a transform domain. For example, M. Lustig et al. have proposed the application of CS for rapid MR imaging (M. Lustig et al.: "Sparse MRI: The Application of Compressed Sensing for Rapid MR Imaging", Magnetic Resonance in Medicine, 58, 1182-1195, 2007). It is also known that, since additional prior information about the unknown MR image may be available in certain applications, it is advantageous to incorporate this prior information into the CS reconstruction.

Further techniques for accelerating MR acquisition are known as parallel acquisition techniques. Methods in this category are SENSE (Pruessmann et al., "SENSE: Sensitivity Encoding for Fast MM", Magnetic Resonance in Medicine 1999, 42 (5), 1952-1962) and SMASH (Sodickson et al., "Simultaneous acquisition of spatial harmonics (SMASH): Fast imaging with radiofrequency coil arrays", Magnetic Resonance in Medicine 1997, 38, 591-603). SENSE and SMASH use sub-sampled k-space data acquisition obtained from multiple RF receiving antennas (coils) in parallel. In these methods, the (complex) signal data from the multiple coils are combined with complex weightings in such a way as to suppress sub-sampling artefacts (aliasing) in the finally reconstructed MR images. This type of complex array combining is sometimes referred to as spatial filtering, and includes combining which is performed in the k-space domain (as in SMASH) or in the image domain (as in SENSE), as well as methods which are hybrids. In either SENSE or SMASH, it is essential to know the proper weightings or sensitivities of the coils with high accuracy. To obtain the coil sensitivities, i.e. the spatial sensitivity profiles of the array RF coils used for signal detection, a calibration pre-scan is typically performed prior to and/or after the actual image acquisition. In the pre-scan, which is also sometimes referred to as reference scan, the MR signals are usually acquired at a resolution which is significantly lower than the resolution required for the final diagnostic MR image.

Techniques for MR image acquisition and reconstruction have recently become known in which Compressed Sensing reconstruction is combined with parallel MR signal acquisition.

It is an object of the invention to provide an improved method that enables reconstruction of high-quality MR images from sparsely sampled MR signal data.

In accordance with the invention, a method of MR imaging of at least a portion of a body of a patient placed in an examination volume of a MR device is disclosed. The method comprises the steps of:

subjecting the object to an imaging sequence for acquiring MR signal data, wherein the MR signal data are acquired as a function of k-space position and time by using an irregular k-space sampling pattern with sub-sampling of k-space;

reconstructing MR image data from the MR signal data, which MR image data comprise spatial dimensions and a frequency dimension, sparsity of the MR image data in a transform domain being exploited for suppressing sub-sampling artefacts in the MR image data.

An essential aspect of the invention is the sub-sampled MR signal acquisition with a time dimension. The time dimension corresponds to a frequency dimension of the reconstructed MR image data. The method of the invention can thus be said to be a method of spatial-spectral MR imaging. To this end, the MR signals are acquired in accordance with the invention for different time intervals between the excitation of magnetic resonance and the actual instant of MR signal acquisition. The MR signals may, for example, be generated as spin echoes or gradient echoes, wherein the MR signals are acquired for different echo time values in accordance with the invention. The different echo time values span the time dimension of the MR signal data in this case. Spectral information is provided by the method of the invention which can be attributed to the spatial coordinates. The spectral information can be used to provide different types of image contrast. The spectral information can further be used, for example, to separate MR signals emanating from fat protons from MR signals emanating from water protons. Efficient water/fat separation can be achieved in this way.

As opposed to regular sampling, the irregular k-space sampling according to the invention makes the MR image reconstruction more difficult. On its own, this complexity is a disadvantage. However, it has to be taken into account that regular sub-sampling of k-space will cause sub-sampling artefacts at a few discrete positions within the reconstructed MR images. Opposed to that, with irregular k-space sampling according to the invention, an imperfect MR image reconstruction will result in similar (or even more pronounced) artefacts, but these artefacts will be "scrambled" in the reconstructed MR images. In other words, the irregular k-space sampling results in incoherent aliasing artefacts. It can be exploited according to the invention that such incoherent artefacts can be suppressed more easily than coherent artefacts obtained by regular sampling of k-space. The term "aliasing artefacts" refers in this context to all artefacts that emerge from the sub-sampling of k-space as compared to the density required by the Nyquist criterion with respect to the size of the patient's body portion under study. These incoherent artefacts are removed according to the invention by exploiting the sparsity of the MR image data in a transform domain, for example by means of the per se known Compressed Sensing technique. In the transform domain, in which the image data are sparse, the artefacts are separated from the useful information, for example by using a non-linear filtering operation.

The transformation into the transform domain, in which the MR image data are sparse, may be referred to as "sparsifying" transformation. In accordance with a preferred embodiment of the invention, the properties of this sparsifying transformation of the MR image data in the frequency dimension are different from the properties in the spatial dimensions. This can be based on the following principles: Edges of the MR image data (i.e. boundaries between adjacent image features) are supposed to be sparse in spatial dimensions, while the MR image data itself are supposed to be sparse in the frequency dimension. In the frequency dimension, for each spatial location, the MR image data is expected to be non-zero only for a very limited set of frequency values. The frequency position where the MR image data is expected to be non-zero, is typically a continuous function in the spatial coordinates, except for occasional sudden changes. Such changes are likely to co-incide with a pre-defined value, e.g., 3.4 ppm (i.e. the difference in frequency between fat and water protons). Moreover, these changes are likely to coincide with edges in the spatial dimensions. Other criteria are imaginable.

The advantages of the irregular sampling pattern for MR signal acquisition both in the k-space dimensions and the (echo) time dimension are a particularly short scan time without the necessity to exactly control the switched magnetic field gradients, while the precise k-space coordinates and time values have to be known, of course, for each MR signal sample in order to enable reconstruction.

In one embodiment of the invention, the k-space sampling scheme is chosen such that it includes continuous random k-space trajectories. It is for example possible to randomly or pseudo-randomly vary a magnetic field gradient during MR signal acquisition. The k-space coordinate values as well as the time value are attributed to each MR signal sample during the acquisition procedure in order to enable reconstruction. The technical requirements for the gradient system of the used MR apparatus are low with this embodiment of the invention. No particularly fast gradient switching is required. The noise level caused by the gradient switching can be kept well within tolerable limits for the examined patient.

The method of the invention is preferably combined with non-Cartesian sampling schemes. Spiral scanning may be applied. Also radial k-space sampling is a possible variant.

Although the k-space scanning pattern is irregular in accordance with the invention, a certain extent of control over the density of scanning of k-space, as well as the timing scheme of k-space sampling should be established in order to optimally condition the reconstruction problem of the invention. It turns out that it is advantageous in terms of conditioning of the reconstruction problem to select the k-space sampling pattern such that it includes continuous k-space trajectories that re-visit k-space regions for acquisition of the MR signal data. Re-visiting means that MR signals are acquired from the same regions of k-space at different (echo) time values. By re-visiting k-space regions it is ensured that the space spanned by the k-space dimensions and the (echo) time dimension is appropriately covered with regard to MR image reconstruction. In other words, an irregular (random) k-space sampling scheme may advantageously be applied in accordance with the invention with a constrained spatio-temporal sampling density.

In one embodiment of the invention, an almost uniform density over the scanned region in k-space may be aimed at. In another embodiment, a k-space sampling pattern may be preferred in which a central region of k-space is sampled at a higher density than the peripheral regions.

The method of the invention may for example be combined advantageously with the k-space sampling disclosed in the article "Fast Three-Dimensional k-Space Trajectory Design Using Missile Guidance Ideas", Magnetic Resonance in Medicine 52:329-336 (2004). A set of such trajectories, each starting off in a different direction from the k-space center, may be used. In this way, each region of k-space is visited once per trajectory, with a different echo time for each trajectory.

Also a spiral or spiral-like trajectory proceeding outwards in k-space and then inwards again may be applied for k-space sampling in accordance with the invention. The extension of each spiral in k-space may be made random to a certain extent, such that the outer portions of k-space are visited less often than the inner portions. Preferably, the trajectory of k-space sampling is not an exact spiral, but a spiral with random perturbations. A sampling density constraint may be defined which determines the average number of k-space locations to be sampled as a function of the distance from k-space center and time.

In a further variant, a radial-type trajectory may be applied in accordance with the invention, wherein the k-space trajectory proceeds outwards in k-space, then returns to the center, and then continues to another angle. The angle between subsequent radial trajectories can preferably be made equal to the Golden Angle, or may otherwise be chosen to guide each new trajectory in a direction that was not or only sparsely visited by a previous trajectory. In a three-dimensional acquisition, the direction of each new radial trajectory may be determined by two angles that can be chosen according to the two-dimensional Golden means similarly to the method described in "Temporal Stability of Adaptive 3D Radial MRI Using Multidimensional Golden Means" in Magnetic Resonance in Medicine 61:354-363 (2009). Moreover, the "trajectory length" (i.e. the distance covered by a trajectory proceeding from k-space center to the periphery before the trajectory returns to the k-space center) may be randomly varied from radial trajectory to radial trajectory.

According to a preferred embodiment of the invention, the MR signal data are acquired by means of parallel imaging via two or more RF receiving antennas having different spatial sensitivity profiles. Parallel imaging can be used to further speed up the acquisition procedure. The reconstruction of the MR image data may involve re-gridding of the MR signal data to a regular k-space, for example by applying a convolution operation, wherein the convolution kernel is appropriately chosen. The basic idea of this approach is to apply a direct convolution from irregular k-space positions to a regular grid. The convolution kernel can be optimized for each k-space position based on (pre-acquired) spatial sensitivity profiles. The kernel may be obtained by making use of densely scanned areas of k-space, similar to the known GRAPPA reconstruction scheme. The convolution operation performs a transformation from a set of N RF antenna data sets (N being the number RF receiving antennas used for MR signal acquisition) to one single re-gridded k-space data set. As a next step, the re-gridded MR signal data can be Fourier-transformed and non-linear noise-reduction filtering may be applied (such as described, for example, in "Nonlinear Anisotropic Filtering of MR Data", Guido Gerig et al, IEEE Transactions on Medical Imaging, 11(2), 221-232, 1992, or in "Noise Reduction for Magnetic Resonance Images via Adaptive Multiscale Products Thresholding", Paul Bao and Lei Zhang, IEEE Transactions on Medical Imaging, 22(9), 1089-1099, 2003, or in WO 97/23844 A1). Such a filtering algorithm implicitly contains a transformation to a sparse transform domain in accordance with the invention. The reconstruction of the MR image data may be implemented as an iterative algorithm with the essential steps: 1. re-gridding (using a specifically computed kernel), 2. Fourier-transform, 3. non-linear filtering, and 4. repetition of steps 1-3.

The method of the invention described thus far can be carried out by means of a MR device including at least one main magnet coil for generating a uniform steady magnetic field within an examination volume, a number of gradient coils for generating switched magnetic field gradients in different spatial directions within the examination volume, at least one RF coil for generating RF pulses within the examination volume and/or for receiving MR signals from a body of a patient positioned in the examination volume, a control unit for controlling the temporal succession of RF pulses and switched magnetic field gradients, a reconstruction unit, and a visualization unit. The method of the invention is preferably implemented by a corresponding programming of the reconstruction unit, the visualization unit, and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
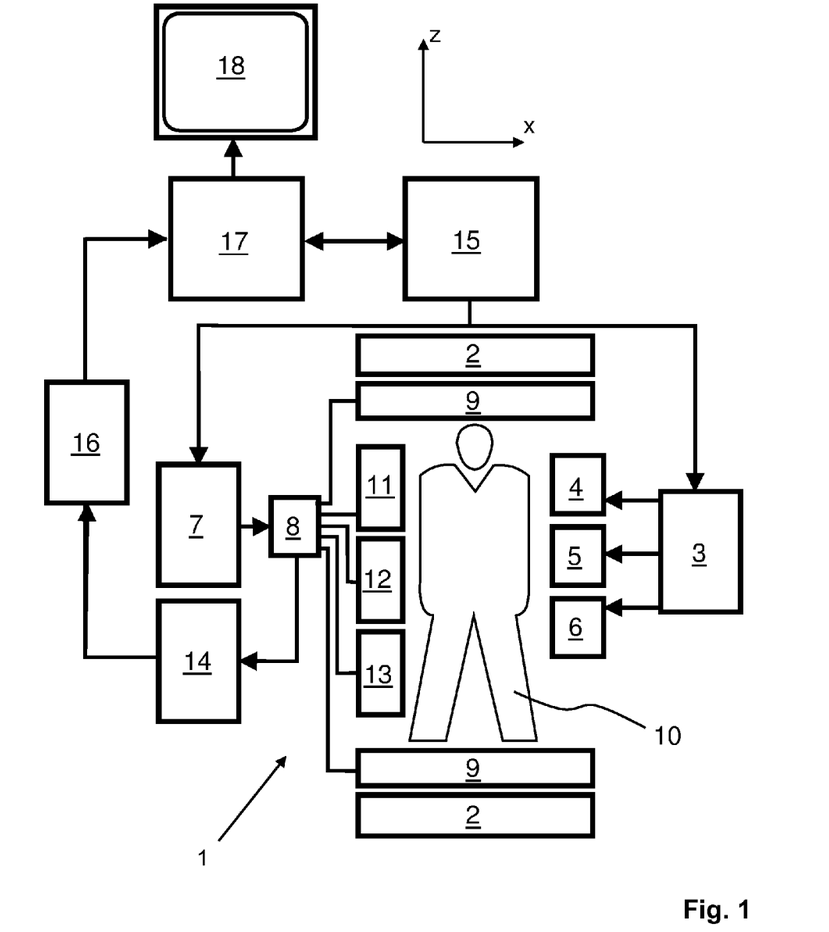
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of gradient coils 4, 5 and 6 along x, y and z-axes of the examination volume. A digital RF frequency transmitter 7 transmits RF pulses or pulse packets, via a send-/receive switch 8, to a whole-body volume RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the whole-body volume RF coil 9.

For generation of MR images of limited regions of the body 10, a set of local array RF coils 11, 12, 13 are placed contiguous to the region selected for imaging. The array coils 11, 12, 13 can be used for parallel imaging to receive MR signals induced by body-coil RF transmissions.

The resultant MR signals are picked up by the whole body volume RF coil 9 and/or by the array RF coils 11, 12, 13 and demodulated by a receiver 14 preferably including a pre-amplifier (not shown). The receiver 14 is connected to the RF coils 9, 11, 12 and 13 via send-/receive switch 8.

A host computer 15 controls the gradient pulse amplifier 3 and the transmitter 7 to generate the imaging sequence of the invention. The receiver 14 receives MR signals at different echo time values following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data. Ultimately, the digital raw image data is reconstructed into an image representation by a reconstruction processor 17 which applies appropriate reconstruction algorithms. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

Figure 2:
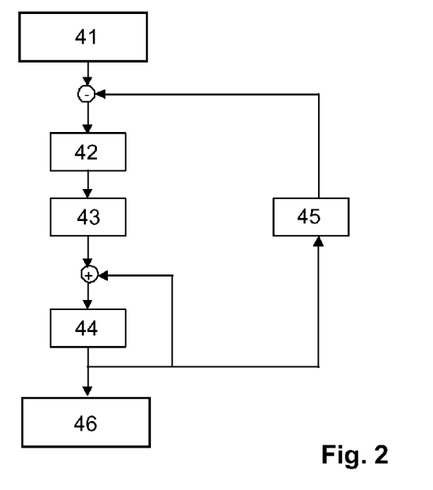
FIG. 2 an iteration scheme for MR image reconstruction according to the invention as a block diagram.

The MR image acquisition and reconstruction technique of the invention is illustrated in FIG. 2.

The method starts in step 41 with subjecting the portion of the body 10 to an imaging sequence for acquiring MR signal data, wherein the MR signal data are acquired as data in $(k_x, k_y, k_z, t)$-space, i.e. as a function of k-space position and echo time, by using an irregular k-space sampling pattern with sub-sampling of k-space. The MR signal data are acquired via the RF receiving antennas 11, 12, 13. As a next step 42, re-gridding of the MR signal data to a regular grid in $(k_x, k_y, k_z, t)$-space is performed. Thereafter, a Fourier transformation of the re-gridded MR signal data is performed in step 43 such that a MR image data set in $(x, y, z, \omega)$-space is obtained. A non-linear filter (such as, e.g., the L1-norm, like in conventional Compressed Sensing) is applied to the Fourier transformed data in step 44. The non-linear filtering implicitly performs a transformation to a sparse domain as it is required by Compressed Sensing. The image reconstruction may end after step 44. However, depending on the k-t-space acquisition scheme and the quality of the acquired MR signal data, iterations may be useful. To this end, the filtered data are transformed back to $(k_x, k_y, k_z, t)$-space by inverse Fourier transformation in step 45 to obtain a set of intermediate MR signal data. These intermediate MR signal data are interpolated to the sampling positions in $(k_x, k_y, k_z, t)$-space of the originally acquired MR signal data set. The interpolated intermediate MR signal data are subtracted from the originally acquired MR signal data to obtain a set of difference MR signal data. Then the next iteration starts, wherein the difference MR signal data are re-gridded again. The steps of Fourier transformation 43 and non-linear filtering 44 are repeated for the re-gridded difference MR signal data, wherein the Fourier-transformed data of the current and the previous repetitions are added up prior to applying the noise-reduction filter in step 44. A final MR image data set 46 is obtained $(x, y, z, \omega)$-space after a number of iterations.

Figure 4:
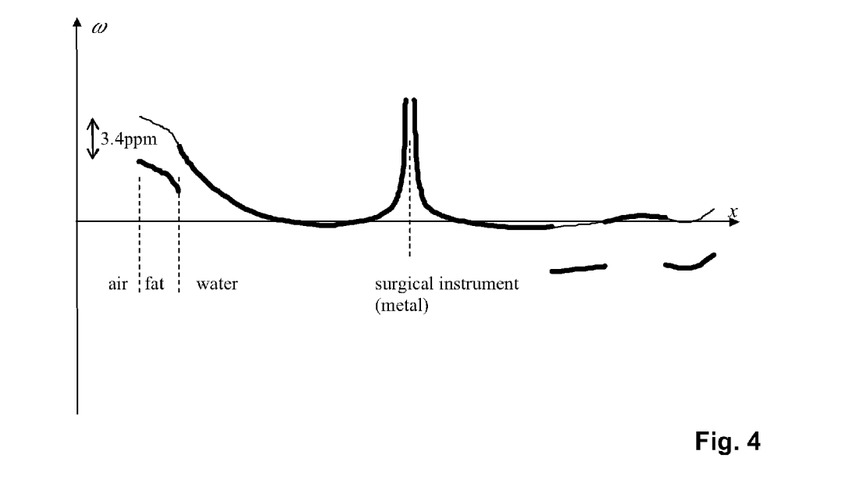
FIG. 4 shows a diagram of an example of MR image data having a spatial dimension and a frequency dimension according to the invention.

According to the invention, the exact k-space positions of acquired MR signal data a randomized. Any aliasing artefacts that are due to sub-sampling are made incoherent in this way. The removal of the incoherent artefacts (or at least parts thereof) is performed in accordance with the invention in a domain in which the image data are sparse. In that domain, the artefacts are separated from the useful information using a non-linear filtering step, as already mentioned above. Different types of such "sparsifying" transforms are applicable. A simple transform is, for example, the gradient operation that essentially creates an edge image from the MR image data. Therein every pixel value is replaced by the difference between the respective pixel value and the values of one or more neighbouring pixels. It is important in this context that the "sparsifying" transformation of the MR image data acts differently in the frequency dimension than in the spatial dimensions. Edges of the MR image data (i.e. boundaries between adjacent image features) are supposed to be sparse in spatial dimensions, while the MR image data itself are supposed to be sparse in the frequency dimension. For each spatial location, the MR image data is expected to be non-zero only for a very limited set of frequency values (as can be seen in FIG. 4). The frequency coordinates at which the MR image data is non-zero, is typically a continuous function in the spatial coordinates (for example near metal parts, such like surgical instruments), except for occasional sudden changes. Such changes are likely to co-incide with a pre-defined value, e.g., 3.4 ppm (i.e. the difference in frequency between fat and water protons). Moreover, these changes are likely to coincide with edges in the spatial dimensions. Hence, a transformation that transforms the MR image data into an edge image (for example by computing the image gradients at each voxel position) could be used in the spatial dimensions, while a unity transformation is used in the frequency dimension. More elaborate "sparsifying" transformations are of course conceivable.

Figure 3:
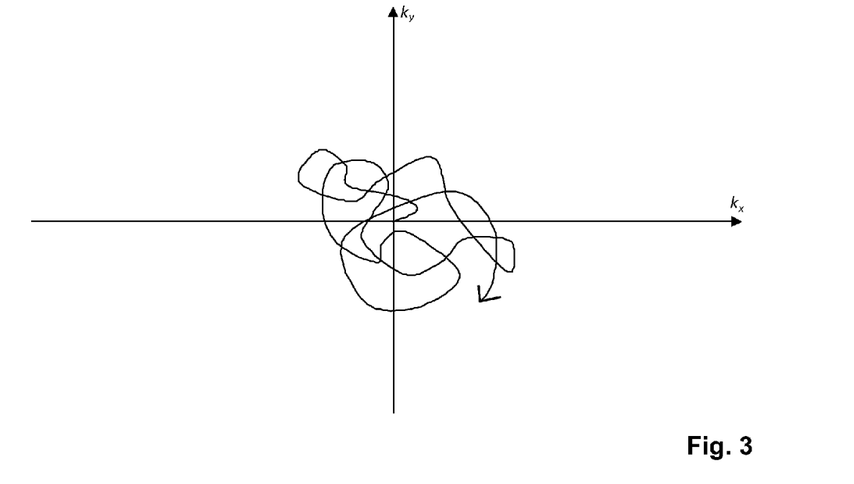
FIG. 3 illustrates irregular k-space sampling according to the invention.
Figure 5:
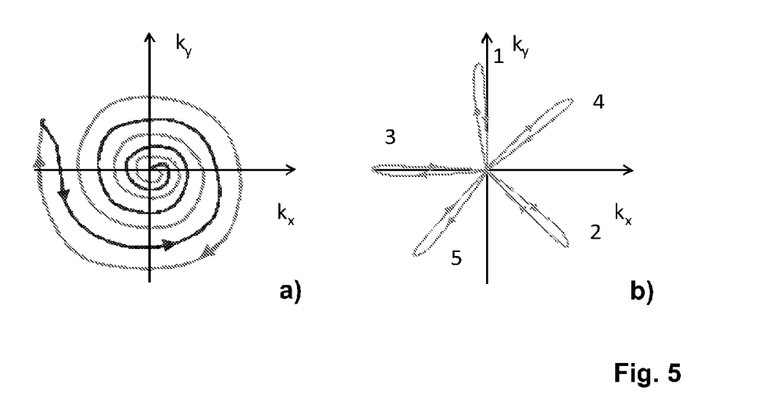
FIG. 5 schematically shows non-Cartesian k-space sampling schemes applicable according to the invention.

FIG. 3 and FIG. 5 outline embodiments of irregular non-Cartesian k-space sampling patterns that may be employed in accordance with the invention. An irregular (random) k-space sampling scheme may advantageously be applied with a constrained spatio-temporal sampling density. It is advantageous in terms of conditioning of the reconstruction problem to select the k-space sampling pattern such that it includes k-space trajectories that re-visit k-space regions for acquisition of the MR signal data (wherein the "visits" of the respective k-space regions should be substantially different in time). A sampling density constraint may be defined which determines the average number of k-space locations to be sampled as a function of the distance from k-space center and time. FIG. 5a illustrates a spiral or spiral-like trajectory proceeding outwards in k-space and then inwards again. The spirals are determined such that the outer portions of k-space are visited less often than the inner portions. The trajectory of k-space sampling is not an exact spiral, but a spiral with random perturbations. FIG. 5b shows a radial-type trajectory, wherein each k-space trajectory ("spoke") proceeds outwards in k-space, then returns to the center, and then continues to another angle. The angle between subsequent spokes is equal to the Golden Angle such that each new spoke is guided in a direction that was not visited by a previous spoke. The numbers in FIG. 5b indicate the temporal acquisition order of the spokes.

FIG. 4 illustrates the hypothetical case, in which the k-space sampling pattern (as, for example, shown in FIG. 3) is infinitely dense. In this case, the MR signal data could be gridded to a regular grid in ($k_x$, $k_y$, $k_z$, t)-space (t may for example be the echo time in case the MR signals are generated as spin echoes or gradient echoes) and Fourier-transforms to (x, y, z, $\omega$)-space. The resulting MR image data thus comprise spatial dimensions and a frequency dimension ($\omega$). FIG. 4 shows only the (x, $\omega$)-dimensions for clarity. In practice, of course, the k-space scan-trajectory does not sample the ($k_x$, $k_y$, $k_z$, t)-space to an infinitely dense degree. Hence, plain gridding and Fourier-transformation of the data would result in MR image data having very strong artefacts. In order to suppress these artefacts, the sparsity of the MR image data in a transform domain is exploited, for example according to Compressed Sensing, as explained above.

The invention claimed is:

1. Method of MR imaging of an object placed in an examination volume of a MR device comprising the steps of:
subjecting the object to an imaging sequence for acquiring MR signal data, by means of parallel imaging via two or more RF receiving antennas having different spatial sensitivity profiles,
wherein the MR signal data are acquired as a function of k-space position and time by using an irregular k-space sampling pattern with sub-sampling of k-space
wherein the k-space sampling pattern includes continuous random k-space trajectories generated by randomly or pseudo-randomly varying a magnetic field gradient during MR signal acquisition,
wherein the k-space sampling pattern includes k-space trajectories that re-visit k-space regions for acquisition of the MR signal data, and
reconstructing MR image data from the MR signal data, wherein the MR image data comprise spatial dimensions and a frequency dimension,
wherein sparsity of the MR image data in a transform domain is exploited for suppressing sub-sampling artefacts in the MR image data,
wherein the reconstruction involves re-gridding of the MR signal data to a regular k-space grid.

2. The method of claim3 1, wherein non-Cartesian sampling of k-space is applied for acquisition of the MR signal data.

3. The method of claim 1, wherein the MR image data are reconstructed by means of Compressed Sensing.

4. The method of claim 1, wherein the reconstruction of the MR image data involves transformation into the transform domain in which the MR image data are sparse, wherein the transformation in the frequency dimension operates differently than the transformation in the spatial dimensions.

5. An MR device comprising:
at least one main magnet coil a plurality of gradient coils arranged to generate switched magnetic field gradients in different spatial directions within an examination volume,
at least one RF coil arranged to generate RF pulses within the examination volume and/or for receiving MR signals from an object positioned in the examination volume,
a control unit for controlling the temporal succession of RF pulses and switched magnetic field gradients, and
a reconstruction unit, wherein the MR device is configured to perform the following steps:
subjecting an object to an imaging sequence for acquiring MR signal data, wherein the MR signal data are acquired as a function of k-space position and time by using an irregular k-space sampling trajectory,
wherein the k-space sampling pattern includes continuous random k-space trajectories generated by randomly or pseudo-randomly varying a magnetic field gradient during MR signal acquisition,
wherein the k-space sampling pattern includes k-space trajectories that re-visit k-space regions for acquisition of the MR signal data with sub-sampling of k-space, using parallel imaging via two or more RF receiving antennas having different spatial sensitivity profiles and and
reconstructing MR image data from the MR signal data, which MR image data comprise spatial dimensions and a frequency dimension, sparsity of the MR image data in a transform domain being exploited for suppressing sub-sampling artefacts in the MR image data wherein the reconstruction involves re-gridding of the MR signal data to a regular k-space grid.

6. A non-transitory computer readable medium having stored thereon a computer program comprising instructions that when executed by a processor causes the processor to perform a method comprising:
generating an imaging sequence for acquiring MR signal data, wherein the MR signal data are acquired as a function of k-space position and time by using an irregular k-space sampling trajectory,
wherein the k-space sampling pattern includes continuous random k-space trajectories generated by randomly or pseudo-randomly varying a magnetic field gradient during MR signal acquisition, wherein the k-space sampling pattern includes k-space trajectories that re-visit k-space regions for acquisition of the MR signal data with sub-sampling of k-space;

reconstructing MR image data from the MR signal data, which MR image data comprise spatial dimensions and a frequency dimension, sparsity of the MR image data in a transform domain being exploited for suppressing sub-sampling artefacts in the MR image data, wherein the reconstruction involves re-gridding of the MR signal data to a regular k-space grid.

* * * * *